(12) United States Patent
Phillips et al.

(10) Patent No.: US 6,614,508 B2
(45) Date of Patent: Sep. 2, 2003

(54) REVERSED, DOUBLE-HELICAL BELLOWS SEAL

(75) Inventors: Alton Hugh Phillips, Mountain View, CA (US); Hiroshi Sugimoto, Osaka (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/932,828

(22) Filed: Aug. 16, 2001

(65) Prior Publication Data

US 2003/0035095 A1 Feb. 20, 2003

(51) Int. Cl.[7] ................ G03B 27/58; G03B 27/42; F16L 21/00; F16L 11/10
(52) U.S. Cl. ............... 355/72; 355/53; 285/227; 138/121
(58) Field of Search .............. 355/30, 53, 72–76; 138/121, 177; 285/227

(56) References Cited

U.S. PATENT DOCUMENTS

| | | | |
|---|---|---|---|
| 4,125,130 A | 11/1978 | Yamamoto | 138/121 |
| 4,969,169 A | 11/1990 | Forsyth et al. | 378/34 |
| 4,980,896 A | 12/1990 | Forsyth et al. | 372/101 |
| 5,191,218 A | 3/1993 | Mori et al. | 250/453.11 |
| 5,346,513 A | 9/1994 | Taniguchi et al. | 29/25.01 |
| 5,784,925 A | 7/1998 | Trost et al. | 74/490.09 |
| 5,799,699 A | 9/1998 | Chiang | 138/121 |
| 6,065,499 A | 5/2000 | Pless et al. | 138/118 |
| 2001/0040375 A1 * | 11/2001 | Aschoff et al. | 285/227 |

FOREIGN PATENT DOCUMENTS

| | | |
|---|---|---|
| EP | 1098225 A2 | 5/2001 |
| EP | 1 284 444 A1 | 2/2003 |
| WO | WO 00/74120 | 12/2000 |

OTHER PUBLICATIONS

Miller et al., The Development of 157nm Small Field and Mid-Field MicroStepphers, SPIE 2000 #4000 Jul., 2000.

* cited by examiner

*Primary Examiner*—Henry Hung Nguyen
(74) *Attorney, Agent, or Firm*—Beyer Weaver & Thomas, LLP

(57) ABSTRACT

A double bellows seal including a plurality of rings having first and second end rings, a middle ring, a first bellows, and a second bellows. The first bellows is formed from a flexible material that is sealingly connected between the first end ring and the middle ring, and it has a twist bias in a first rotational direction relative to an axis of the rings. The second bellows is formed from a flexible material that is sealingly connected between the second end ring and the middle ring. The second bellows has a twist bias in a second rotational direction relative to an axis of the rings that is opposite that of the first rotational direction.

13 Claims, 7 Drawing Sheets

REVERSED, DOUBLE-HELICAL BELLOWS SEAL

CROSS-REFERENCE TO RELATED APPLICATION

This application is also related to U.S. patent application Ser. No. 09/658,615, filed on Sep. 8, 2000 entitled "MODULAR EXPOSURE APPARATUS WITH REMOVABLE OPTICAL DEVICE AND IMPROVED ISOLATION OF THE OPTICAL DEVICE," the content of which is hereby incorporated by reference.

STATEMENT REGARDING FEDERALLY SPONSORED RESEARCH OR DEVELOPMENT

Not Applicable

FIELD OF THE INVENTION

The present invention relates generally to bellows seals, and more specifically to bellows seals having low vibration transmissibility.

BACKGROUND

In semiconductor processing, exposure apparatuses are commonly used to transfer images from a reticle onto semiconductor wafers. Typical exposure apparatuses include a support frame, a measurement system, a control system, an illumination source, an optical device, a reticle stage for retaining a reticle, and a wafer stage for retaining a semiconductor wafer. The reticle stage, wafer stage and the optical device are commonly contained within separate enclosures or chambers to reduce the chances of cross-contamination, reduce the time required to purge each enclosure after accessing, and to improve system modularity.

The size of the features within the images transferred onto the wafers from the reticle are extremely small. Accordingly, the relative positioning of the reticle stage and wafer stage to the optical device is critical to the manufacturing of high density, semiconductor wafers. Therefore, exposure apparatuses are very sensitive to vibrations, which can move the stages out of precise relative alignment. Sources of mechanical vibrations are located both inside and outside of the exposure apparatuses. For example, the reticle stage can generate reaction forces that vibrate the wafer stage, and vice-versa, which may cause relative misalignment between the stages. Each of these stages can also vibrate and cause misalignment of the optical device. Floor vibrations can also vibrate exposure apparatuses. In addition to affecting the alignment of the exposure apparatuses, mechanical vibrations can cause the measurement system to improperly measure the positions of the stages relative to the optical device. Also, vibration of the optical device can cause deformations of the lens elements within, thereby degrading the optical imaging quality.

Currently, the exposure apparatus enclosures containing the reticle stage, wafer stage and optical device are commonly connected to each other through conventional bellows seals and scrunched bellows seals. See FIG. 1, which provides a side plan view of a conventional bellows seal 100 having a height, H, and a diameter, D. See FIG. 2A, which provides a side plan view of a scrunched bellows seal 200 having a height, H, and a diameter, D. FIG. 2B illustrates a pre-scrunched bellows seal before becoming scrunched into the configuration shown in FIG. 2A. Directional reference arrows are also illustrated to show the six possible degrees-of-freedom. Both conventional bellows seals and scrunched bellows seals are stiff in twisting (about the axial direction, $\Theta_z$) and translational (in the radial direction, x or y) motions when the diameter of the seals, D, is much larger than the height of the seals, H. This relationship of diameter versus height is common since exposure apparatus enclosures generally have large openings and are positioned closely together. Unfortunately, the stiffness of these bellows seals allow vibration to be more easily transmitted through the seals from one enclosure to the next. As discussed above, such transmission of vibration causes misalignment, measurement and deformation problems. A further disadvantage regarding the conventional bellows seal 100 is that expensive tooling is required to form each of the pleats 102. A further disadvantage of the scrunched bellows seal 200 is that the buckling of the random pleats tend to cause mircovibrations and non-deterministic, discontinuous reaction forces during motion.

In view of the foregoing, an improved seal for connecting separate enclosures that allows for a reduced amount of vibration to be transmitted through the seal would be desirable.

SUMMARY

The present invention pertains to a double bellows type seal that can provide a passageway between enclosed chambers. These chambers may be chambers containing semiconductor-manufacturing equipment. The significance of the inventive double bellows seal is such that its high degree of flexibility in all six degrees of freedom greatly minimizes the amount of vibration that may pass from one chamber to the other. This flexibility is especially critical in semiconductor manufacturing environments where mechanical vibrations may disturb the finely adjusted alignment between various chambers. The combination of two bellows also substantially eliminates any tendencies of the seal to impose rotational and translational forces upon each of the chambers during seal movements. In one embodiment of the present invention, the flexible double bellows seal includes a plurality of rings including first and second end rings, a middle ring, a first bellows, and a second bellows. The first bellows is formed from a flexible material that is sealingly connected between the first end ring and the middle ring, and it has a twist bias in a first rotational direction relative to an axis of the rings. The second bellows is formed from a flexible material that is sealingly connected between the second end ring and the middle ring. The second bellows has a twist bias in a second rotational direction relative to an axis of the rings that is opposite that of the first rotational direction. In addition to minimizing the transmission of vibration between the enclosures that the double bellows seal connects, the helical pleats of the bellows are relatively easy to manufacture.

Another aspect of the present invention relates to a photolithography system that utilizes the double bellows seal. This photolithography system includes a reticle stage contained within a first chamber, an optical device contained within a second chamber, a wafer stage contained within a third chamber, and a first and second double bellows seal as described in the preceding paragraph. The first double bellows seal connects the first and second chambers and the second double bellows seal connects the second and third chambers.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail so not to unnecessarily obscure the present invention.

The present invention pertains to a helical bellows type seal that can provide a passageway between enclosed chambers. These chambers may be chambers containing semiconductor-manufacturing equipment. The significance of the inventive bellows seal is such that its high degree of flexibility in all six degrees of freedom greatly minimizes the amount of vibration that may pass from one chamber to the other. This flexibility is especially critical in semiconductor manufacturing environments where mechanical vibrations may disturb the finely adjusted alignment between various chambers. The combination of two bellows also substantially eliminates any tendencies of the seal to impose rotational and translational forces upon each of the chambers during seal movements. In one embodiment of the present invention, the flexible double bellows seal includes a plurality of rings including first and second end rings, a middle ring, a first bellows, and a second bellows. The first bellows is formed from a flexible material that is sealingly connected between the first end ring and the middle ring, and it has a twist bias in a first rotational direction relative to an axis of the rings. The second bellows is formed from a flexible material that is sealingly connected between the second end ring and the middle ring. The second bellows has a twist bias in a second rotational direction relative to an axis of the rings that is opposite that of the first rotational direction. In addition to minimizing the transmission of vibration between the enclosures that the helical bellows seal connects, the helical pleats of the bellows seal are relatively easy to manufacture.

Figure 3:
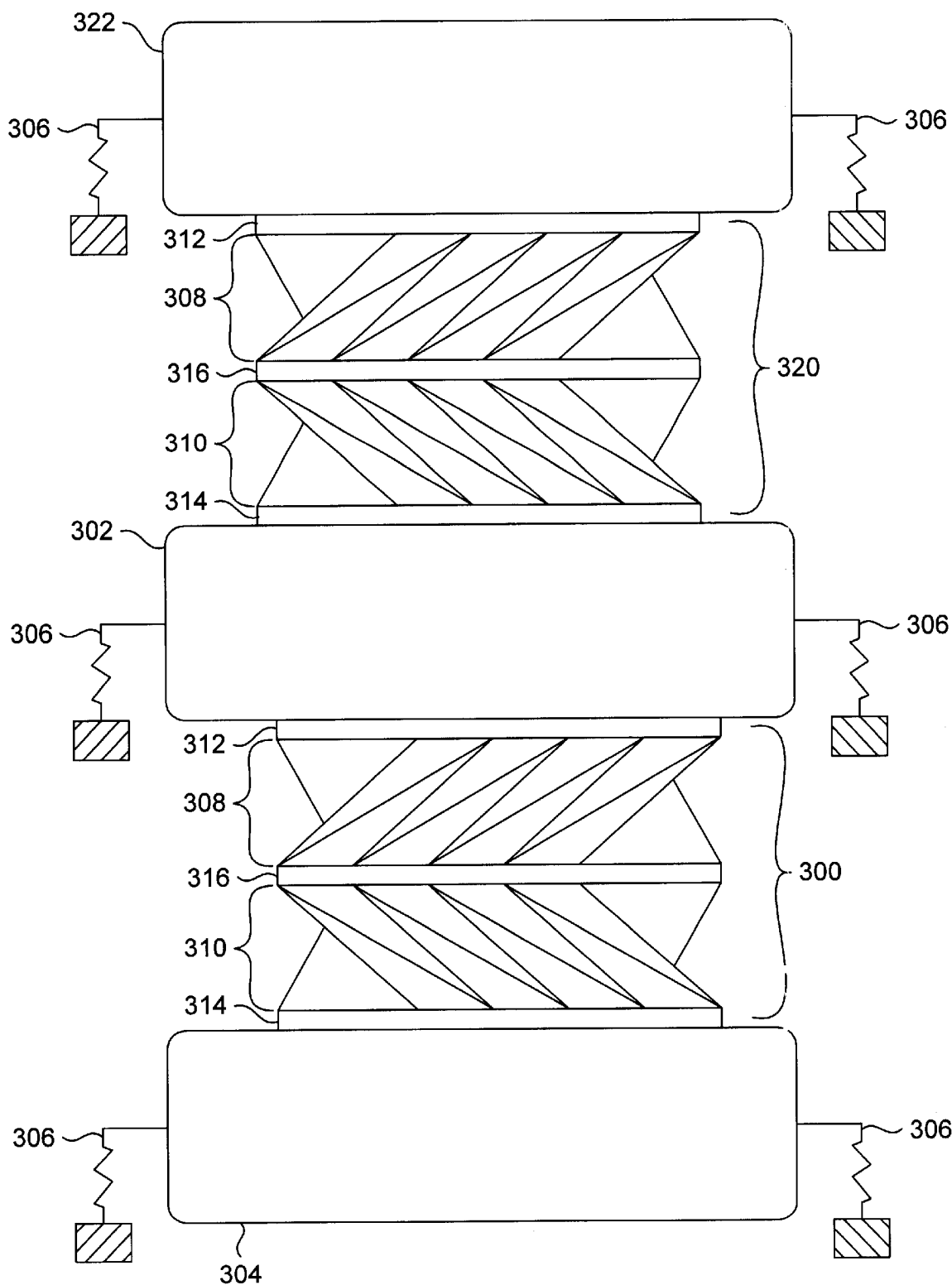
FIG. 3 illustrates two double bellows seals that connect and provide contained passageways between enclosed chambers according to one embodiment of the present invention.

FIG. 3 now is referenced to provide a better understanding of one of the envisioned applications of the inventive double bellows seal. FIG. 3 illustrates two double bellows seals 300 and 320 that connect and provide contained passageways between enclosed chambers 302, 304 and 322. Each of the chambers 302, 304, and 322 are stabilized by isolating springs 306 such that vibrational forces reaching the chambers are minimized. In FIG. 3, chambers 302, 304 and 322 may be the chambers of a semiconductor manufacturing system. Chambers 302, 304, and 322 can contain an optical device, a wafer stage, and a reticle stage, respectively. In such a system, seals 300 and 320 provide the connection between the stages that allows for the manufacturing interactions between the stages to occur without contamination from the outside atmosphere. For more description regarding semiconductor processing systems, refer to U.S. patent application Ser. No. 09/658,615, entitled, "MODULAR EXPOSURE APPARATUS WITH REMOVABLE OPTICAL DEVICE AND IMPROVED ISOLATION OF THE OPTICAL DEVICE."

Each of the double bellows seals 300 and 320 are formed of two helical bellows 308 and 310, two end rings 312 and 314, and one middle ring 316. Each of the helical bellows 308 and 310 is a flexible tube-shaped material having been twisted at each tube end in opposing directions. The twisted flexible material thereby obtains pleats running in a helical pattern along the axial length of the tubes. An important aspect of the present invention, which will be explained further below, requires the bellows 308 and 310 to have opposing twist directions. The bellows 308 and 310 are connected to each other through middle ring 316. The bellows 308 and 310 of each seal 300 and 320 are each connected to one of the chambers through end rings 312 and 314. Seal 300 connects chambers 302 and 304, while seal 320 connects chambers 322 and 302.

The bellows material should have several important characteristics. First, the helical bellows 308 and 310 are preferably formed of a non-permeable material so that gases are either contained within or kept outside of the environment of the chambers 302 and 304. Secondly, the bellows material should have a minimal amount of its own out-gassing so not to contaminate the environment within chambers 302, 304 and 322. Additionally, as mentioned above, the material should have a low stiffness factor so that minimal amounts of force will travel through seals 300 and 322 from one chamber to the other. One family of materials that can satisfactorily form the bellows is that of organic films. The organic film family includes materials such as polyester, polyethylene and polyimide. These organic films are available in commercial products such as Mylar™ and Kapton™ by DuPont, Eval™ by Kuralay, and Mictron™ by Toray Industries, Inc.

Some of these organic films, such as Mylar and Eval are not resistant to ultraviolet (UV) light and would deteriorate after long exposure.

Kapton, is UV resistant, but is relatively expensive.

Some films outgas excessively, or react with the enclosed environments to release unwanted contaminants.

To overcome the shortcomings of organic films, the films can be combined with a thin aluminum barrier to form a laminate. The aluminum barrier (when located between the interior of the chamber and the organic film), provides a chemically clean, ultraviolet (UV) resistant interface, free of out gassing, and highly impervious to helium and other gases.

However when the aluminum barrier is expected to undergo multiple flexing, it is necessary to laminate the aluminum barrier between two organic films. This prevents aluminum fatigue cracks after multiple flexing. In this case, the aluminum barrier only improves laminate impermeability.

The preferred laminate in this bellows is an aluminum barrier between two layers of Eval film. This provides a low-cost, low out gassing, highly impervious flexible material for the bellows.

The middle and end rings should also have certain characteristics. Similarly to the bellows material, the rings should also have low out-gassing and non-permeable characteristics. At least the middle ring 316 should be rigid or semi-rigid. However, it may be more cost effective to manufacture both of the end rings and the middle ring to be rigid. As such, materials like aluminum, ferrous and non-ferrous metals, allows, ceramics, some plastics, among others, may be used to form the rings. Preferable, stainless steel is used to form the middle and end rings.

One of the advantages of using bellows that are helical in shape is that the seals may easily be formed by twisting the ends of the tube-shaped material in opposing directions. Practically, the twisting formation of the bellows is performed by attaching rings onto each of the ends of the tube-shaped bellows, and then twisting the rings. This method of forming the helical bellows is especially appropriate when the bellows are formed of thin polyester or polyethylene. In general, the twisting method of forming the bellows gives the bellows pleats, or folds, that are uniform in size.

To ensure uniformity in the size and location of the pleats, substantially flat and triangular shaped stiffeners can be attached to the bellows to ensure the formation of pleats in only the desired positions. For example, see FIG. 4, which illustrates triangular shaped stiffeners 400 attached to the bellows seal such that the bellows folds between each of the triangular stiffeners 400. The stiffeners 400 can be solid triangular stiffeners or they can be triangular outline shaped stiffeners. Such stiffeners can be formed of, for example, flat pieces of plastic, multiple layers of bellows material, or from thicker layers of bellows material. The stiffeners can be attached to the bellows seal in a variety of manners that include the use of epoxy glue and ultrasonic welding. The size of the stiffeners can be adjusted in order to obtain a predetermined size for each pleat within the bellows. Stiffeners can be attached to the inside, outside or both surfaces of the bellows seals depending upon the system in which the bellows seal is used. For example, the stiffeners would be placed on the outside surface of the bellows in situations where the outgassing of the epoxy glue would contaminate the environment contained within a system.

Next, the description of the inventive double bellows seal will cover the general concept of how the seal moves in the six degrees of freedom. After this general explanation is given, the movement of the seal in each of the degrees of freedom will be described in more detail with the aid of FIGS. 5–8.

Figure 1:
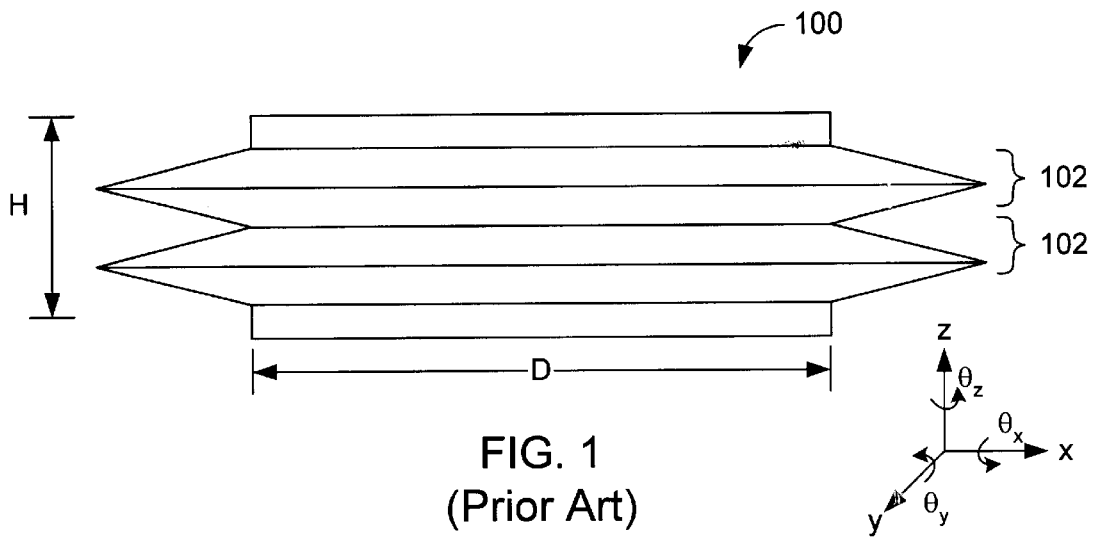
FIG. 1 illustrates a side plan view of a conventional bellows seal having a height, H, and a diameter, D.
Figure 2A:
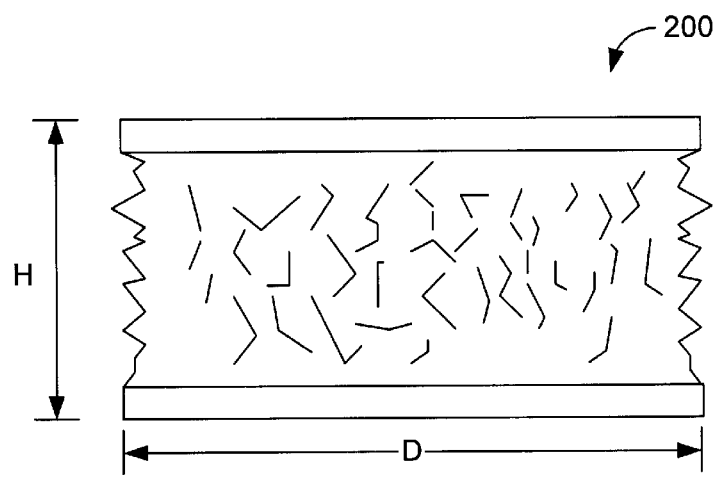
FIG. 2A illustrates a side plan view of a scrunched bellows seal having a height, H, and a diameter, D.
Figure 2B:
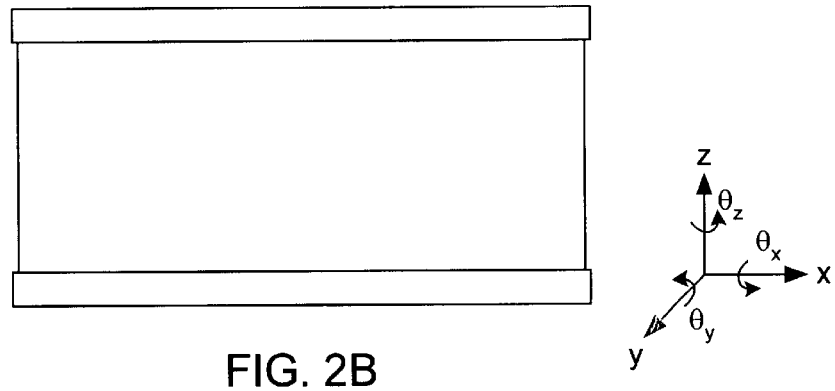
FIG. 2B illustrates a pre-scrunched bellows seal before becoming scrunched into the configuration shown in FIG. 2A.

As illustrated in FIG. 1 (and again in FIG. 4) by the reference coordinate system, there are six degrees of freedom. The first three degrees of freedom are in the translational directions: x, y and z. The second three degrees of freedom are in the rotational directions: $\Theta_x, \Theta_y,$ and $\Theta_z$, wherein each rotational motion centers about its respective axis.

The inventive bellows seal is referenced to as the double bellows seal since it is composed of two bellows sections. Also, the inventive bellows seal is generally described to connect two chambers, for example, semiconductor equipment chambers. However, it must be appreciated that the inventive bellows seal may connect bodies other than semiconductor manufacturing chambers. For instance, the seals may also connect appendages of a robotic arm or of a multi-axis CNC milling machine. The bellows seals can also be used between a wafer loader chamber and a wafer stage chamber and between a reticle loader chamber and a reticle stage chamber in a semiconductor exposure apparatus.

The movements of the inventive bellows seal minimizes the amount of force that may be transmitted from one end of the seal to the other, thereby tending to maintain the vibration isolated state of the chambers connected by the seal. In general, it is the flexibility of the double bellows seal in all six degrees of freedom that allows for the low transmission of forces between the two chambers that the seal connects. The seal behaves generally in accordance with the well known relationship between an applied force, F, an amount of displacement, x, and a constant of elasticity (or spring constant, k), F=kx. The bellows seal is made to be very flexible because of its low constant of elasticity, k, in all degrees of freedom, therefore, allowing minimal amounts of force to be applied to one of the chambers when the other chamber is displaced by a distance x. The low constant of elasticity is a result of the seal having two bellows seals that are connected by a middle ring such that the seals have twist directions that are opposed to each other. This double bellows seal configuration gives flexibility in all six degrees of freedom.

The middle ring and the opposing twist directions provide the ability to translate the motion of one seal into an opposing motion in the other seal. For example, an expansion and untwisting of one seal causes the opposing seal to contract and become further twisted. This is particularly advantageous over single bellow seal configurations in that double bellow seal configurations eliminate the tendency that single helical bellows seal configurations have in causing opposite relative rotational and translational forces between the connected chambers. As should be appreciated, the rotation caused by single helical bellows seal configurations is a result of the helical pleats.

Figure 4:
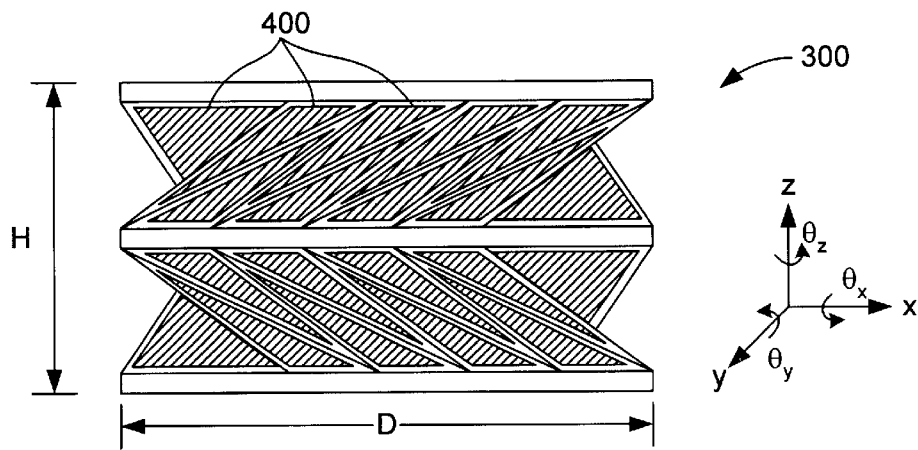
FIG. 4 illustrates an isolated, side plan view of one of the double bellows seal from FIG. 3.

FIG. 4 illustrates an isolated, side plan view of the double bellows seal 300 from FIG. 3. Double bellows seal 300, in FIG. 4, is shown to be in a neutral or a steady state configuration wherein seal 300 is not under any forces and thereby is not deformed or deflected in any direction. The double bellows seal 300 has a diameter defined by the rings, D, and a steady state height, H. The following FIGS. 5–8 will now describe the movement of the double bellows seal 300 in the various degrees of motion with respect to the neutral state shown in FIG. 4. FIGS. 5–8 describe the seal 300 experiencing compression, twisting, pitching, and translational movement, respectively. As should be appreciated, the description of seal 300 in FIGS. 4–8 appropriately describes seal 320 as well.

Figure 5:
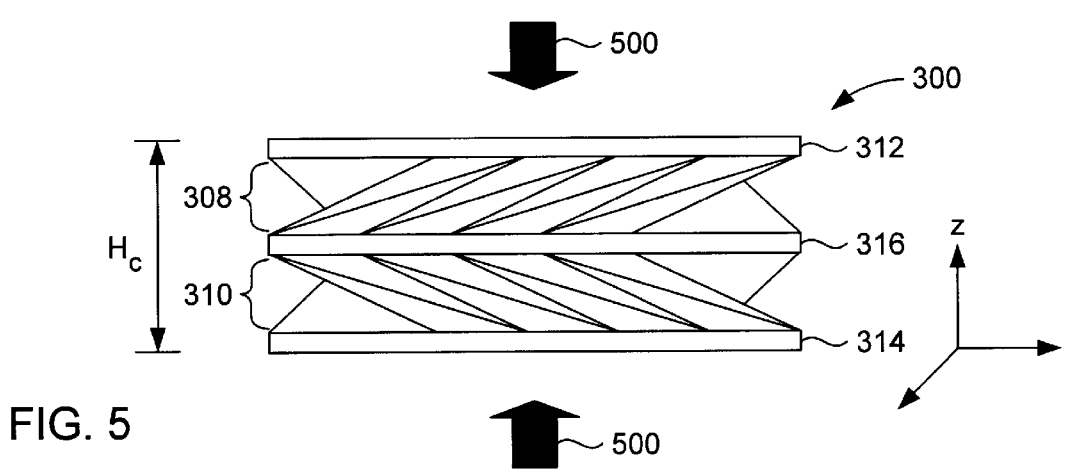
FIG. 5 illustrates the seal in a compressed state as a result of applied compression forces.

As just stated, FIG. 5 illustrates the seal 300 in a compressed state as a result of applied compression forces. The compression forces are represented by arrows 500. FIG. 5 illustrates the double bellows seal 300 movement in the z-direction. The compression forces cause the seal to be compressed and have a height, $H_C$, which is less than the steady state height, H. When seal 300 experiences compression, each of the bellows seals 308 and 310 become further twisted and therefore shorter in height. Along with the twisting of each bellows seal 308 and 310, the opposite ends of each seal tend to rotate in opposite directions. Since the each of the bellows seals 308 and 310 are connected to chambers, through end rings 312 and 314, during actual use, each of the seals twist such that the middle ring 316 rotates relative to the end rings. Specifically, the edge of the middle ring 316 facing the front of the page would rotate towards the left-hand side of the paper.

The same but opposite motions occur when the bellows seal 300 experiences expansion, for example, when the end rings 312 and 314 are pulled further apart. In expansion, the bellows seals 308 and 310 expand by untwisting. The untwisting of each seal causes the middle ring 316 to rotate relative to the end rings 312 and 314 in a direction opposite that of the rotational direction during compression. Specifically, the edge of the middle ring 316 facing the front of the page would rotate towards right-hand side of the paper.

The opposite motions of the double bellows seal 300 gives the seal 300 a high degree of elasticity. Therefore, as the seal 300 compresses or expands, forces are absorbed in the seal 300 rather than being transmitted through the seal. This means a force in the z-direction emanating in one chamber is less likely to be transmitted through the double seal 300 to the attached chamber. Also, the opposing twisting and untwisting actions of the bellows tend to cancel out the tendency that the individual seals would have in causing rotation relative rotation between the connected chambers.

The pleats or folds of the helical seals 308 and 310 are substantially uniform in formation and thereby allow for continuous and deterministic reaction forces during movement. This is advantageous since the performance and reaction forces within the double bellows seal 300 is more predictable. If desired, it is also possible to form the pleats so that they are not uniformly formed on the seals.

Figure 6:
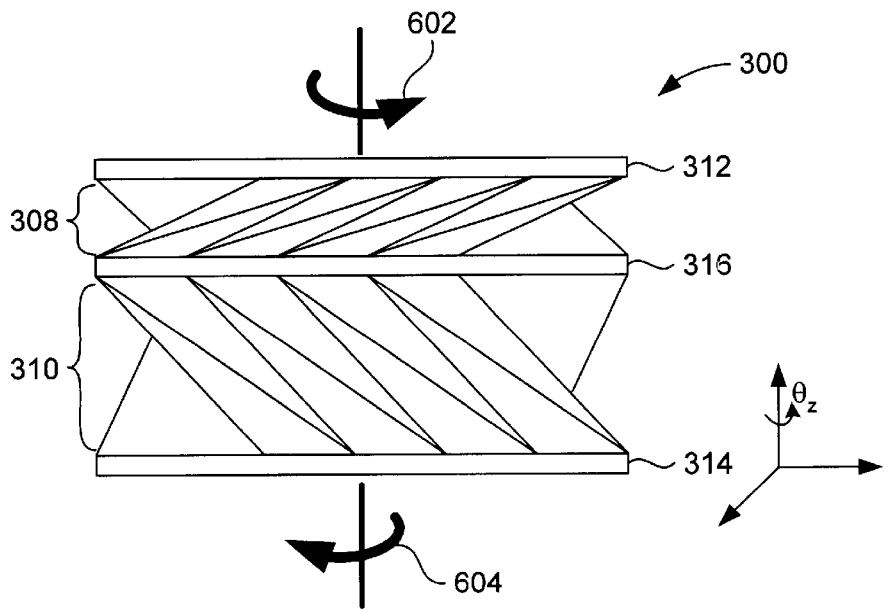
FIG. 6 illustrates movement of the double seal in the $\Theta_z$ direction, wherein the seal is twisted about the z-axis.

FIG. 6 illustrates movement of the double seal 300 in the $\Theta_z$ direction, wherein the seal 300 is twisted about the z-axis. The rotational forces are represented by arrows 602 and 604. Force 602 causes end ring 312 to be rotated in a counter-clockwise direction with respect to the z-axis and force 604 causes end ring 314 to be rotated in a clock-wise direction with respect to the z-axis. The clockwise rotation of the end ring 314 causes the helical bellows 310 to untwist and thereby expand in height. The counter-clockwise rotation of end ring 312 tends to cause the helical bellows 308 to become more twisted and thereby contract in height. Under certain conditions, the overall height of the seal 300 may not change from the steady state conditions because of the opposing height changes in the bellows 308 and 310. However, under other conditions, the overall height of the seal 300 may be different. For example, the material forming one bellows may be different from the material forming the other bellows, or the amount of force applied is sufficiently large to cause unbalanced deformations of the seal 300.

The opposing twisting directions of each end ring 312 and 314 tend to impose rotational forces upon the middle ring 316 in opposing directions. If the opposing forces are equal in magnitude to each other, then the middle ring 316 will remain substantially in the same rotational orientation as it was in steady state. However, if the opposing forces do not exactly counter balance each other, then the middle ring 316 will tend to rotate one way or the other. The expansion of one bellows and the contraction of the other bellows forces the middle ring 316 either higher or lower with respect to the height of the seal 300.

It should be appreciated that when rotational forces in directions opposite to those represented in FIG. 6 are applied, the double bellows seal 300 will experience actions in the opposite directions. Specifically, if force 602 were in the clockwise direction and force 604 were in the counter-clockwise direction, then bellows 308 would untwist and expand, and bellows 310 would become further twisted and contract. At the same time, middle ring 316 will move lower with respect to the height of the bellows seal 300.

The opposing motions of the bellows 308 and 310, together with the middle ring 316 give the bellows seal 300 a high degree of elasticity in the $\Theta_z$ direction. Therefore, as the seal 300 is twisted, the forces are absorbed in the seal 300 rather than being transmitted through the seal. This means a force in the $\Theta_z$ direction emanating in one chamber is less likely to be transmitted through the double seal 300 to the attached chamber. Such rotational forces, if transmitted, would cause undesirable rotational vibrations in the attached chamber. The opposing twisting and untwisting of the two bellows seals 308 and 310 thereby substantially cancel any net rotational force that would be transmitted from one connected chamber to the next.

Figure 7:
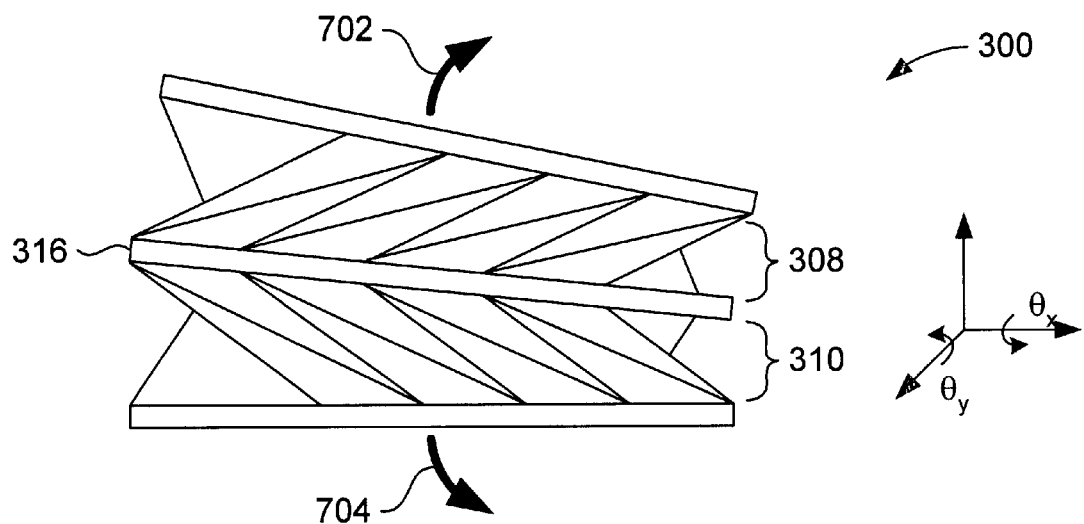
FIG. 7 illustrates the double seal undergoing pitching motion in either the $\Theta_x$ or $\Theta_y$ direction.

FIG. 7 illustrates the double seal 300 undergoing pitching motion in either the $\Theta_x$ or $\Theta_y$ direction. Arrows 702 and 704 represent the forces tending to bend the double bellows seal 300. During pitching motion the middle ring may undergo both rotational and translational motion depending upon the relative twisting and untwisting of the bellows 308 and 310. Also during pitching motion, one side of the bellows 308 and 310 tend to be compressed and the opposite sides of each bellows tend to be pulled apart. The amount of twisting and untwisting of each of the bellows 308 and 310 will depend upon the relative amounts of compression and expansion. Again, the flexibility of the double bellows seal 300 in the pitching directions allows the seal 300 to absorb rather than transmit forces. Also, the double bellows configuration, along with the middle ring 316 substantially cancels out tendencies for the seal 300 to cause relative rotation between the connected chambers.

Figure 8:
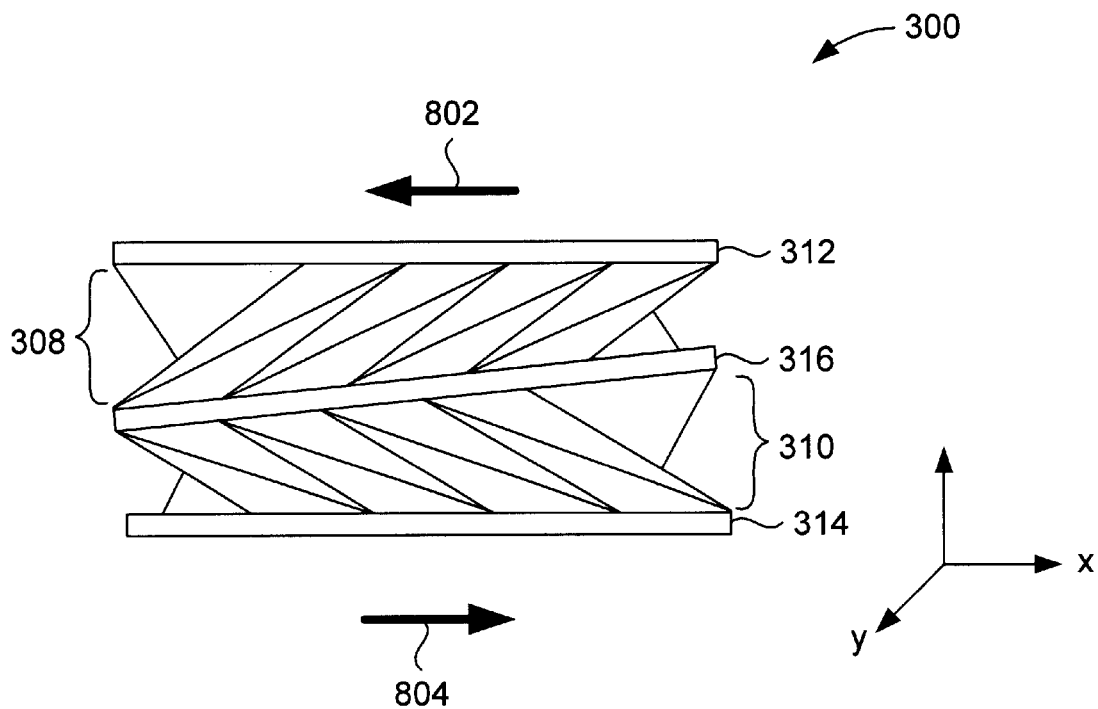
FIG. 8 illustrates the double bellows seal undergoing translational movement in either the x or y directions.

Finally, FIG. 8 illustrates the double bellows seal 300 undergoing translational movement in either the x or y directions. Arrows 802 and 804 represent the forces tending to drag the end rings 312 and 314 in opposite directions. During translational motions the middle ring 316 may undergo both translational and pitching motions. Also during translational motion, one side of a bellows may be compressed while the opposite side of the same bellows becomes pulled apart. At the same time, the other bellows will also experience compression and expansion, however, on opposite sides. The ability of the bellows 308 and 310 to expand and contract allow the end rings 312 and 314 to be pulled in opposite directions and thereby have flexibility in the x and y directions. This flexibility allows the double bellows seal 300 to absorb rather than transmit forces. Double bellows seals manufactured to have larger heights relative to their diameters tend to have increased degrees of translational flexibility. Net rotational and translational forces are also cancelled out by the opposing helical twist directions of each bellows seals.

As should be appreciated, the double bellows seal 300 can undergo simultaneous movement in all six degrees of freedom, or any combination of the various degrees of freedom. While undergoing simulatenous movement in various degrees of freedom, the opposing twist directions of the two bellows allows for a substantially flexible connection between two chambers. Also, the tendency of the two bellows to counteract each other's actions tends to substantially eliminate the imposition of rotational and translational forces upon chambers that are connected to the seal.

In alternative embodiments of the present invention, it is possible to form seals having more than two bellows sections. For example, a seal within the spirit of the present invention can have any even number of bellows sections. In such configurations, there would be a middle ring between every pair of bellows thereby eliminating any tendency for the seal system to cause rotation and/or translation between the chambers that are connected.

Figure 9:
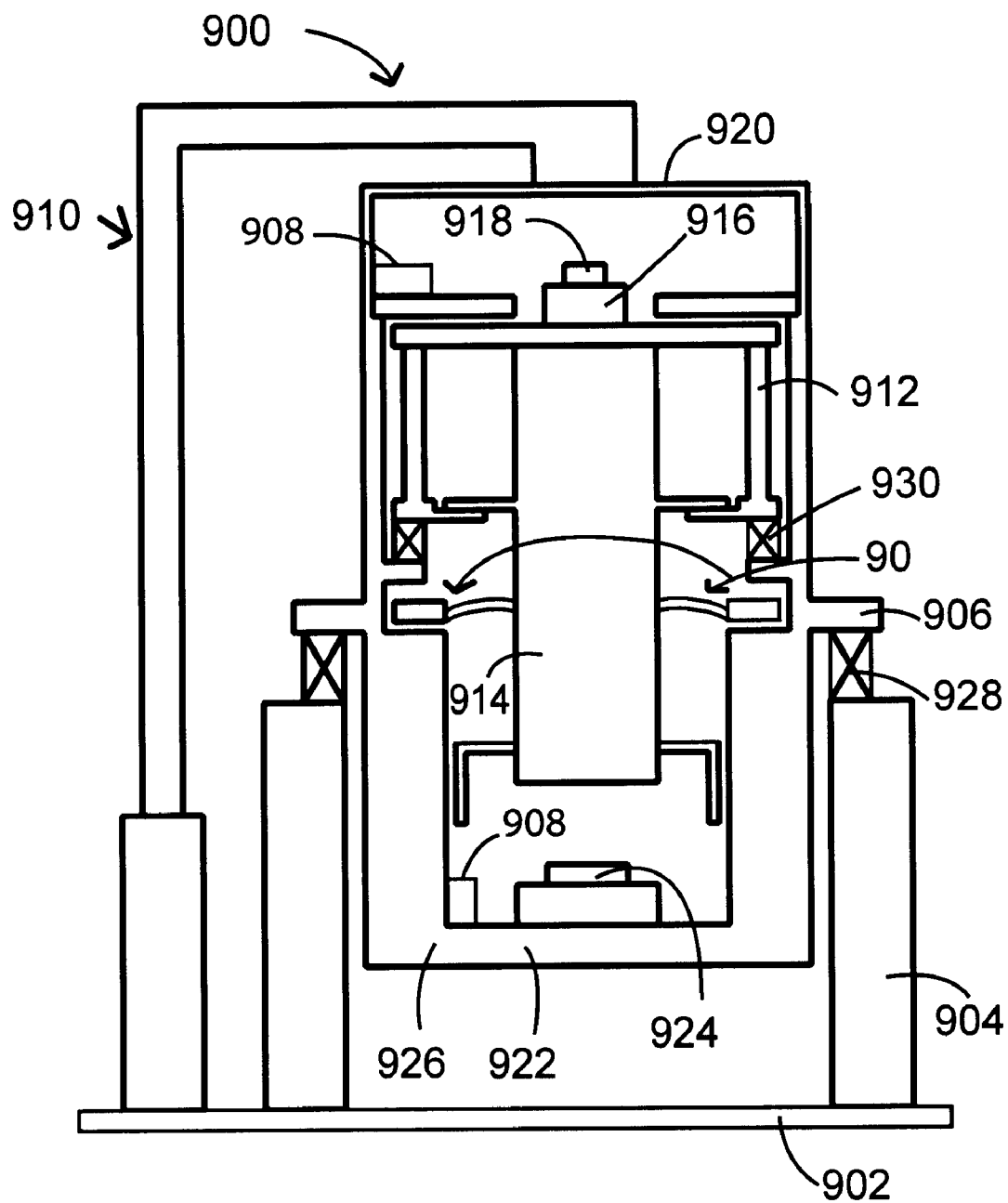
FIG. 9 illustrates one exemplary lithographic exposure machine that incorporates the present invention.

Referring next to FIG. 9, one exemplary lithographic exposure that incorporates the present invention will be briefly described. A typical exposure apparatus 900 includes a mounting base 902, a support frame 904, a base frame 906, a measurement system 908, a control system (not shown), an illumination system 910, an optical frame 912, an optical device 914, a reticle stage 916 for retaining a reticle 918, an upper enclosure 920 surrounding reticle stage 916, a wafer stage 922 for retaining a semiconductor wafer workpiece 924, and a lower enclosure 926 surrounding wafer stage 922.

Support frame 904 typically supports base frame 906 above mounting base 902 through a base vibration isolation system 928. Base frame 906 in turn supports, through an optical vibration isolation system 930, optical frame 912, measurement system 908, reticle stage 916, upper enclosure 920, optical device 914, wafer stage 922, and lower enclosure 926 above base frame 906. Optical frame 912 in turn supports optical devise 914 and reticle stage 916 above base frame 906 through optical vibration isolation system 930. As a result thereof, optical frame 912 and its supported components and base frame 906 are effectively attached in series through base vibration isolation system 928 and optical vibration isolation system 930 to mounting base 902. Vibration isolation systems 928 and 930 are designed to damp and isolate vibrations between components of exposure apparatus 900. Measurement system 908 monitors the positions of stages 916 and 922 relative to a reference such as optical device 914 and outputs position data to the control system. Optical device 914 typically includes a lens assembly that projects and/or focuses the light or beam from an illumination system 910 that passes through reticle 918. Reticle stage 916 is attached to one or more movers (not shown) directed by the control system to precisely position reticle 918 relative to optical device 914. Similarly, wafer stage 922 includes one or more movers (not shown) to precisely position the wafer workpiece 924 relative to optical device (lens assembly) 914. Any of the previously describe seals 932 are placed between base frame 906 (the upper enclosure 920) and the lens assembly 914. The described sealing arrangement provides a good seal for the enclosure 920, yet helps prevent the transmission of vibrations between the enclosure and the lens assembly 914.

As will be appreciated by those skilled in the art, there are a number of different types of photolithographic devices. For example, exposure apparatus 900 can be used as a scanning type photolithography system which exposes the pattern from reticle 918 onto wafer 924 with reticle 918 and wafer 924 moving synchronously. In a scanning type lithographic device, reticle 918 is moved perpendicular to an optical axis of lens assembly 914 by reticle stage 916 and wafer 924 is moved perpendicular to an optical axis of lens assembly 914 by wafer stage 922. Scanning of reticle 918 and wafer 924 occurs while reticle 918 and wafer 924 are moving synchronously.

Alternately, exposure apparatus 900 can be a step-and-repeat type photolithography system that exposes reticle 918 while reticle 918 and wafer 924 are stationary. In the step and repeat process, wafer 924 is in a constant position relative to reticle 918 and lens assembly 914 during the exposure of an individual field. Subsequently, between consecutive exposure steps, wafer 924 is consecutively moved by wafer stage 922 perpendicular to the optical axis of lens assembly 914 so that the next field of semiconductor wafer 924 is brought into position relative to lens assembly 914 and reticle 918 for exposure, Following this process, the images on reticle 918 are sequentially exposed onto the fields of wafer 924 so that the next field of semiconductor wafer 924 is brought into position relative to lens assembly 914 and reticle 918.

However, the use of exposure apparatus 900 provided herein is not limited to a photolithography system for a semiconductor manufacturing. Exposure apparatus 900, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

The illumination source (of illumination system 910) can be g-line (436 nm), i-line (365 nm), KrF excimer laser (248 nm), ArF excimer laser (193 nm) and $F_2$ laser (157 nm). Alternatively, the illumination source can also use charged particle beams such as x-ray and electron beam. For instance, in the case where an electron beam is used, thermionic emission type lanthanum hexaboride ($LaB_6$,) or tantalum (Ta) can be used as an electron gun. Furthermore, in the case where an electron beam is used, the structure could be such that either a mask is used or a pattern can be directly formed on a substrate without the use of a mask.

With respect to lens assembly 914, when far ultra-violet rays such as the excimer laser is used, glass materials such as quartz and fluorite that transmit far ultra-violet rays is preferably used. When the $F_2$ type laser or x-ray is used, lens assembly 914 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces, which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 10:
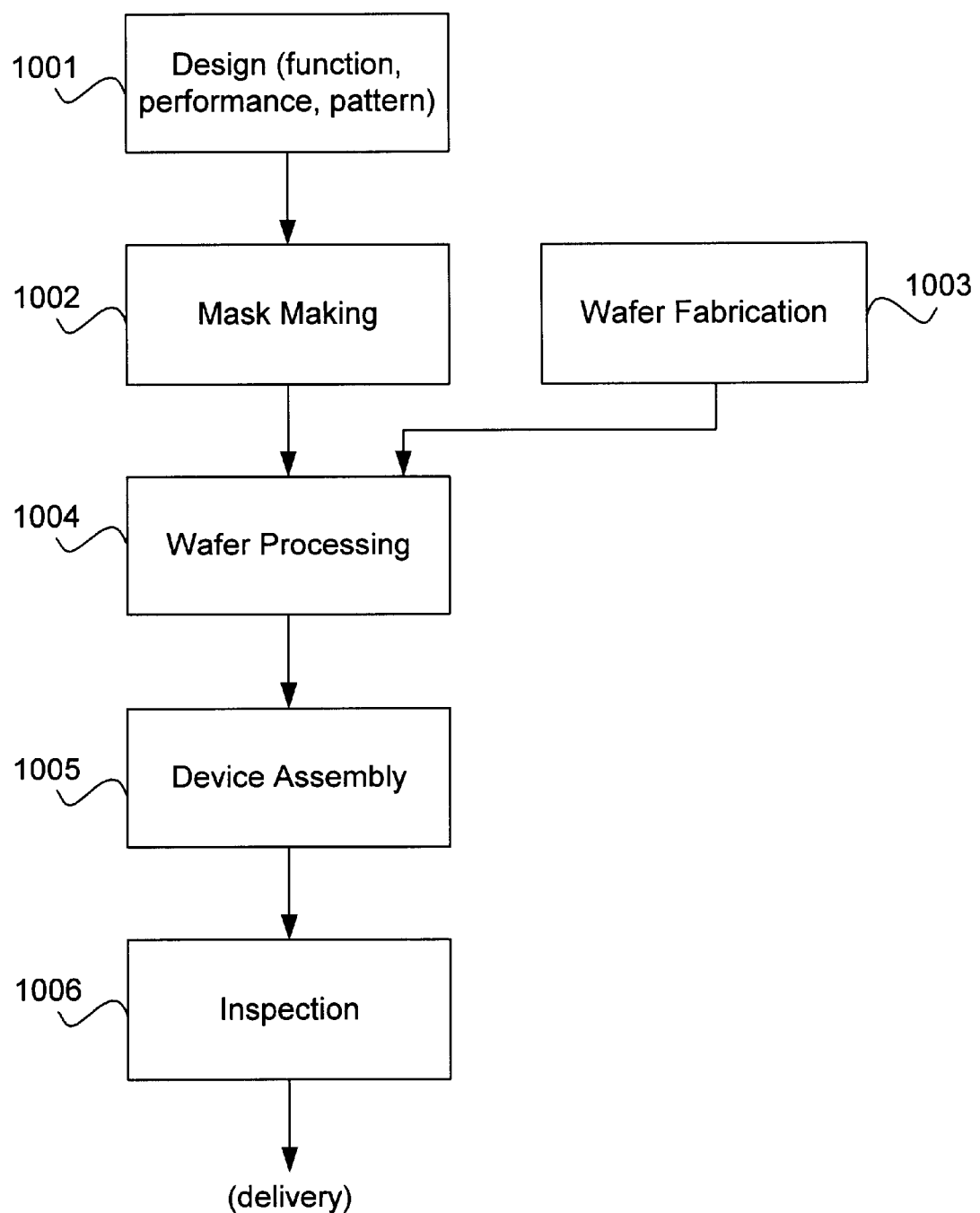
FIG. 10 illustrates an exemplary process for fabricating semiconductor devices using the systems described above.

Further, semiconductor devices can be fabricated using the above described systems, by the process shown generally in FIG. 10. In step 1001 the device's function and performance characteristics are designed. Next, in step 1002, a mask (reticle) having a pattern it designed according to the previous designing step, and in a parallel step 1003, a wafer is made from a silicon material. The mask pattern designed in step 1002 is exposed onto the wafer from step 1003 in step 1004 by a photolithography system such as the systems described above. In step 1005 the semiconductor device is assembled (including the dicing process, bonding process and packaging process), then finally the device is inspected in step 1006.

Figure 11:
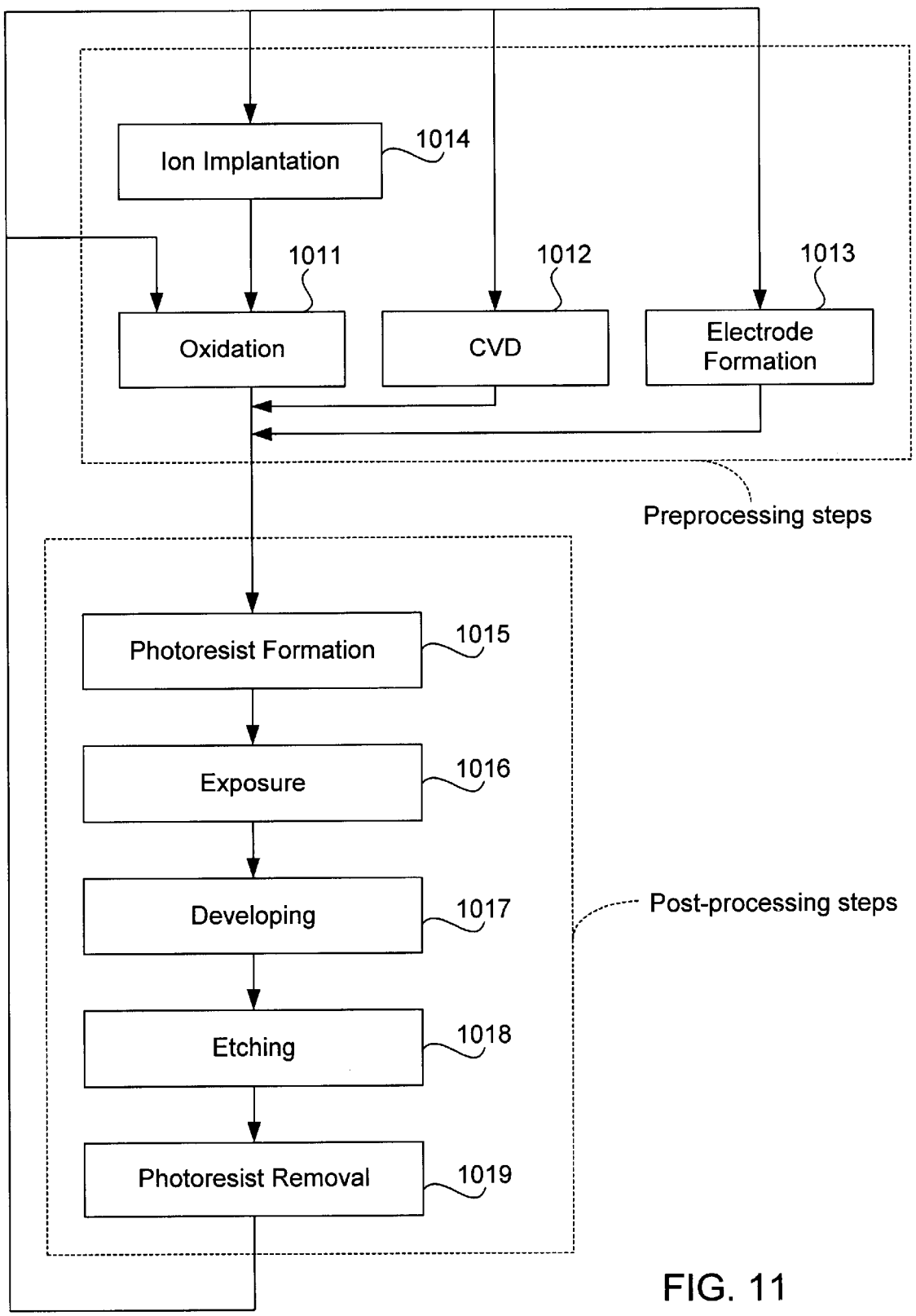
FIG. 11 illustrates a detailed flowchart example of the above-mentioned step 1004 of the process of FIG. 10.

FIG. 11 illustrates a detailed flowchart example of the above-mentioned step 1004 in the case of fabricating semiconductor devices. In step 1011 (oxidation step), the wafer surface is oxidized. In step 1012 (CVD step), an insulation film is formed on the wafer surface. In step 1013 (electrode formation step), electrodes are formed on the wafer by vapor deposition. In step 1014 (ion implantation step), ions are implanted in the wafer. The above mentioned steps 1011–1014 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 1015 (photoresist formation step), photoresist is applied to a wafer. Next, in step 1016, (exposure step), the above-mentioned exposure device is used to transfer the circuit pattern of a mask (reticle) to a wafer. Then, in step 1017 (developing step), the exposed wafer is developed, and in step 1018 (etching step), parts other than residual photoresist (exposed material surface) are removed by etching. In step 1019 (photoresist removal step), unnecessary photoresist remaining after etching is removed. Multiple circuit patterns are formed by repetition of these preprocessing and post-processing steps.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A flexible double bellows seal comprising:
   a plurality of rings including first and second end rings and a middle ring;
   a first bellows formed from a flexible material, the first bellows being sealingly connected between the first end ring and the middle ring, the first bellows having a twist bias in a first rotational direction relative to an axis of the rings; and
   a second bellows formed from a flexible material, the second bellows being sealingly connected between the second end ring and the middle ring, the second bellows having a twist bias in a second rotational direction relative to an axis of the rings that is opposite that of the first rotational direction.

2. A flexible double bellows seal as recited in claim 1 wherein the rings are rigid.

3. A flexible double bellows seal as recited in claim 1 wherein the bellows are substantially cylindrical, the rings are annular and the bellows are biased to form substantially helical pleats.

4. A flexible double bellows seal as recited in claim 1 wherein displacement of the first end ring with respect to the second end ring causes a twisting in one of the bellows and an untwisting the other bellows, the opposing twisting and untwisting of the bellows substantially eliminating the tendency of the flexible double bellows seal to impose rotational and translational forces upon chambers that are attached to each of the end rings.

5. A double bellows seal as recited in claim 1 wherein the first and second bellows are formed of an organic film material.

6. A double bellows seal as recited in claim 1 wherein the organic film material is selected from the group consisting of polyester, polyethylene and polyimide.

7. A double bellows seal as recited in claim 1 wherein the first and second end rings, and the middle ring are formed of materials that have low out-gassing and non-permeable characteristics.

8. A double bellows seal as recited in claim 7 wherein the first and second end rings, and the middle ring are formed of materials selected from the group consisting of aluminum, ferrous and non-ferrous metals, ceramics, and plastics.

9. A double bellows seal as recited in claim 8 wherein the first and second end rings, and the middle ring are formed of stainless steel.

10. A double bellows seal as recited in claim 1 wherein the first and second bellows have pleats that are uniform in size and spacing.

11. A double bellows seal as recited in claim 1 further comprising:
a plurality of triangular shaped stiffeners attached to each of the first and second bellows, each of the bellows having folds along spaces between each of the stiffeners such that substantially helical pleats are formed within each of the bellows.

12. A double bellows seal as recited in claim 11 wherein the stiffeners are attached to an outside surface of each of the bellows.

13. A double bellows seal as recited in claim 11 wherein each of the stiffeners has a triangular outline shape.

* * * * *